United States Patent
Hsieh et al.

(10) Patent No.: US 7,348,654 B2
(45) Date of Patent: *Mar. 25, 2008

(54) CAPACITOR AND INDUCTOR SCHEME WITH E-FUSE APPLICATION

(75) Inventors: Yeou-Lang Hsieh, Sindian (TW); Ching-Kwun Huang, Hsinchu (TW); Yi-Jing Chu, Hsinchu (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 364 days.

This patent is subject to a terminal disclaimer.

(21) Appl. No.: 11/106,089

(22) Filed: Apr. 14, 2005

(65) Prior Publication Data

US 2005/0194350 A1    Sep. 8, 2005

Related U.S. Application Data

(60) Continuation-in-part of application No. 10/926,836, filed on Aug. 26, 2004, now Pat. No. 7,183,625, which is a division of application No. 10/314,664, filed on Dec. 9, 2002, now Pat. No. 6,800,534.

(51) Int. Cl.
*H01L 29/00* (2006.01)
(52) U.S. Cl. ............... 257/528; 438/381; 257/E29.218
(58) Field of Classification Search ............... 438/379, 438/381; 257/379, 528, 533, E29.218
See application file for complete search history.

(56) References Cited

U.S. PATENT DOCUMENTS

| | | | |
|---|---|---|---|
| 5,162,258 A | 11/1992 | Lemnois et al. | |
| 5,708,559 A | 1/1998 | Brabazon et al. | |
| 5,895,948 A | 4/1999 | Mori et al. | |
| 6,180,976 B1 | 1/2001 | Roy | |
| 6,590,473 B1 | 7/2003 | Seo et al. | |
| 6,940,132 B2 * | 9/2005 | Kikuchi | 257/364 |
| 6,962,875 B1 * | 11/2005 | Stamper | 438/672 |
| 7,186,625 B2 * | 3/2007 | Chudzik et al. | 438/387 |
| 2003/0168716 A1 | 9/2003 | Lee et al. | |
| 2004/0135189 A1 * | 7/2004 | Kiyotoshi | 257/306 |
| 2005/0139955 A1 * | 6/2005 | Park et al. | 257/531 |

* cited by examiner

*Primary Examiner*—W. David Coleman
(74) *Attorney, Agent, or Firm*—Duane Morris LLP

(57) ABSTRACT

RF devices formed in integrated circuit devices include a top metal level overlying a substrate. The top metal level comprises pads and portions of planned RF devices and an RF metal level overlying the top metal level completes the RF devices which may be an interconnected RF network that may include capacitors, inductors or both. Openings are formed in a passivation layer overlying the RF metal level to provide direct access to the RF devices. The interconnected RF network may include fuses enabling the network to be selectively altered by cutting relatively thin interconnect lines using a laser directed through the openings. The RF devices or portions of the RF network may be directly coupled to external devices and utilized in SOC (System On a Chip) and SIT (System In Package) technologies.

20 Claims, 16 Drawing Sheets

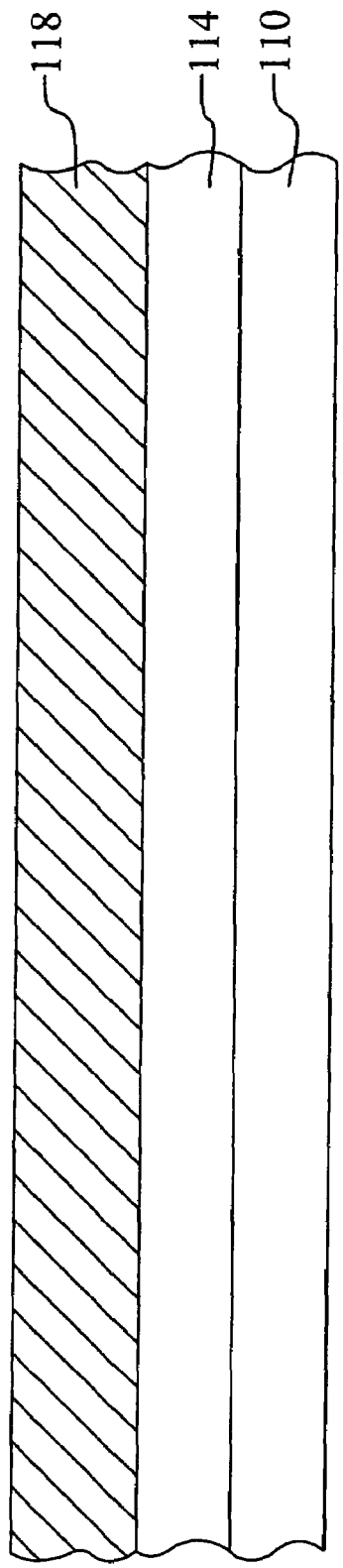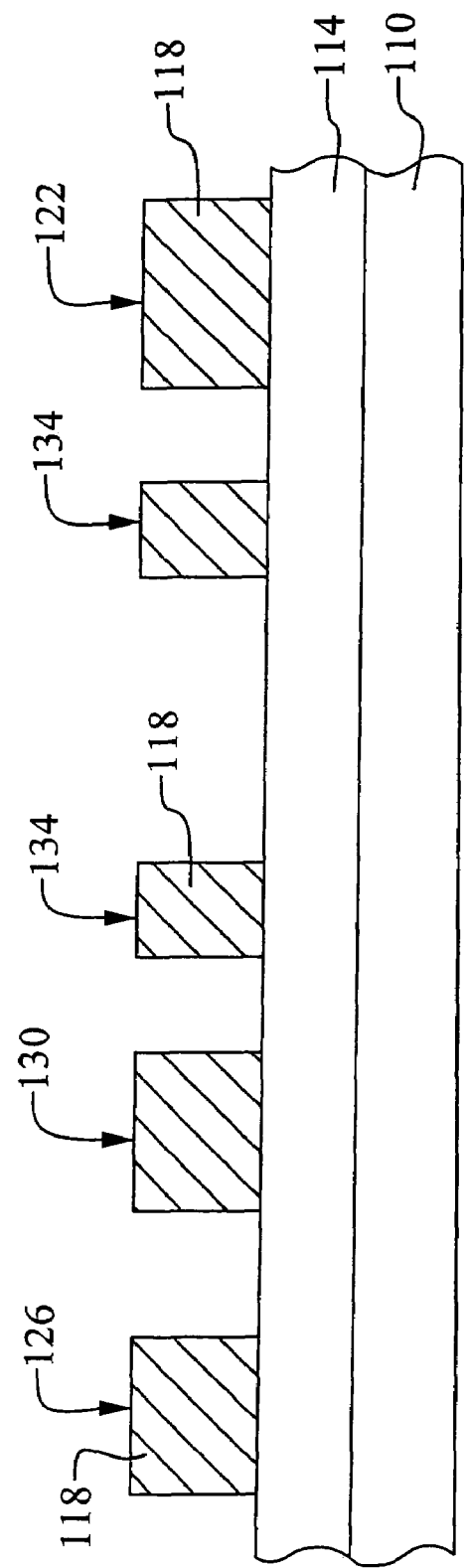

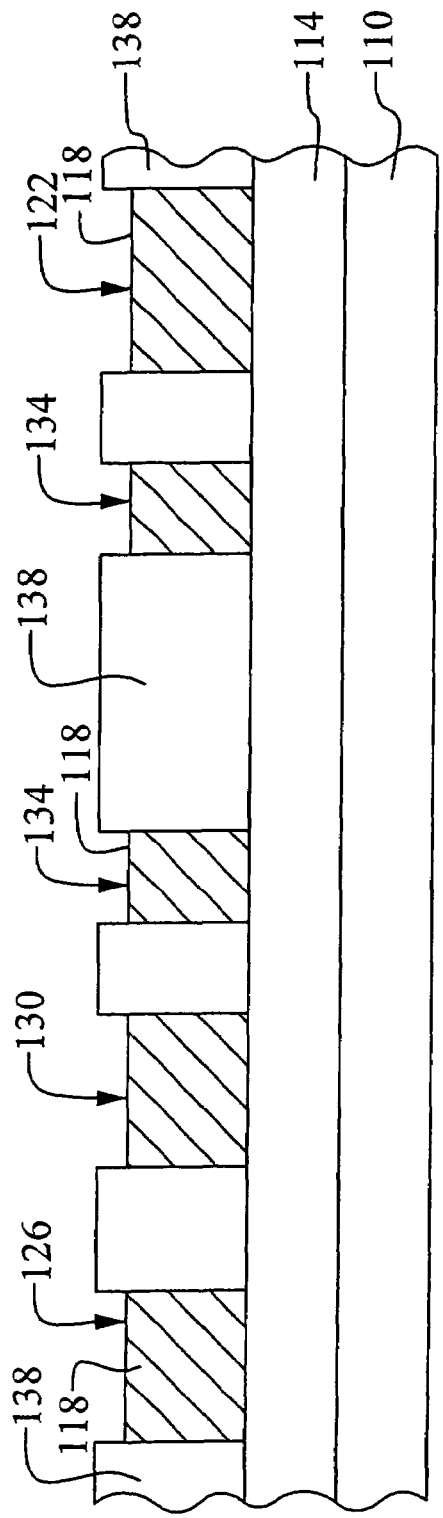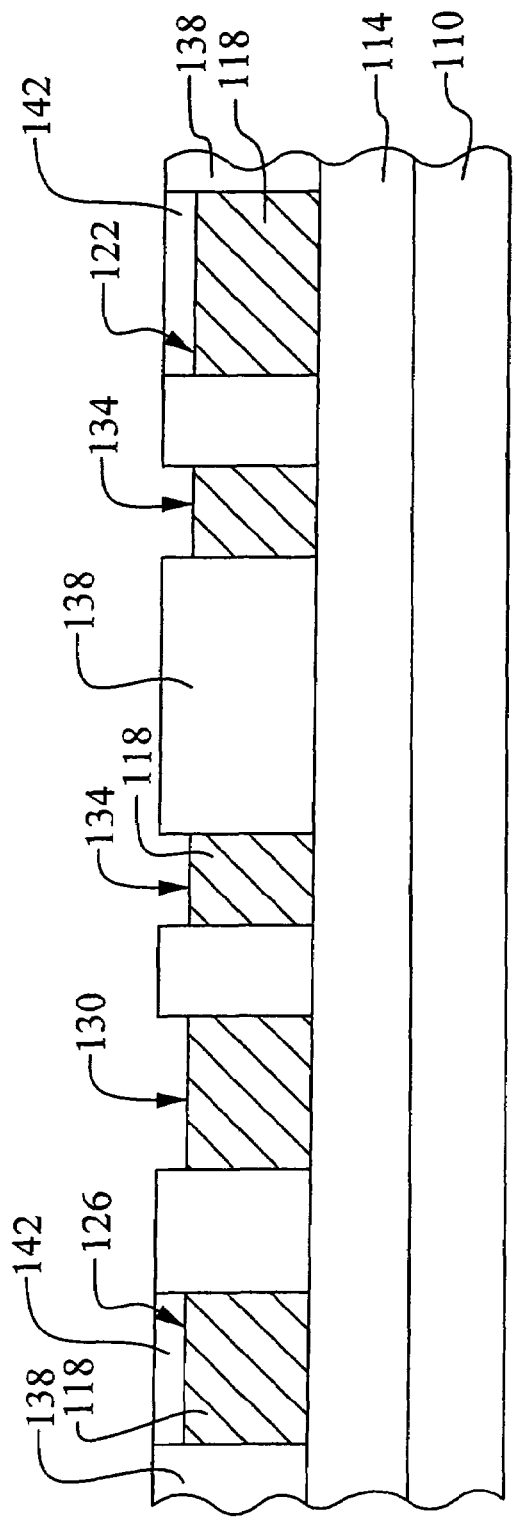
FIG. 7
FIG. 8

CAPACITOR AND INDUCTOR SCHEME WITH E-FUSE APPLICATION

RELATED APPLICATIONS

This application is a Continuation-in-part of application Ser. No. 10/926,836 filed Aug. 26, 2004, now U.S. Pat. No. 7,183,625, which is a Divisional Application of application Ser. No. 10/314,664, filed Dec. 9, 2002 and now issued as U.S. Pat. No. 6,800,534, the contents of each of which are hereby incorporated in their entireties by reference.

FIELD OF THE INVENTION

The invention relates to a structure and method for RF devices in an integrated circuit device, and, more particularly, to an alterable network of RF devices at a chip top level and individually accessible by remote components.

BACKGROUND OF THE INVENTION

Many types of electronic circuits require relatively large value capacitors and inductors. In particular, radio frequency (RF) circuits are those that function at high frequency levels even above the microwave range. Capacitors and inductors are passive components and are herein called RF devices. These RF devices frequently appear in RF circuits either in integrated form or as individual components.

For integrated circuit devices, the formation of large value capacitors and inductors presents a unique challenge for several reasons. First, these devices can consume large chip areas. Second, there can be interference between the capacitor/inductor and other parts of the circuit. These interactions can cause circuit malfunctions and tend to reduce the linearity of the RF devices. Third, it can be difficult to create devices with a large Q value. Fourth, obtaining precise values is difficult due to process variation.

Several prior art inventions relate to the manufacture of metal-insulator-metal (MIM) capacitors in integrated circuit devices. U.S. Pat. No. 6,180,976 B1 to Roy discloses a method to form a MIM capacitor where the bottom plate is a damascene line. U.S. Pat. No. 5,895,948 to Mori et al shows a MIM capacitor process. U.S. Pat. No. 5,162,258 to Lemnios et al describes a method to customize a microwave integrated circuit device by incorporating a MIM capacitor. U.S. Pat. No. 5,708,559 to Brabazon et al discloses several methods to form MIM capacitors.

Referring now to FIG. 1, an exemplary conventional integrated circuit device is shown in cross section. A metal-insulator-metal (MIM) capacitor is formed by a fifth metal level (M5) 18, an insulator layer 22, and a top plate, metal layer 26. The MIM capacitor top plate 26 is coupled to the sixth metal level (M6) 38 through vias 34. A first insulator 14, that may comprise many insulating layers, is shown between the substrate 10 and the capacitor. A second insulator 30 is shown between M5 18 and M6 38. In this example, M6 38 is the top metal level for the process.

By forming the MIM capacitor in an upper metal level, a large capacitor can be constructed without consuming area on the substrate 10 where transistors, not shown, are formed. However, this approach suffers several problems. First, the top plate, metal layer 26 is relatively thin compared to M5 18 or M6 38. This is because the fifth via level 34 must couple M6 38 to M5 18 or to the top plate metal 26. By limiting the top plate metal 26 thickness, the parasitic resistance increases, and the Q value of the capacitor is reduced. Referring now to FIG. 4, the circuit model for the MIM capacitor is shown. The capacitor value is C 90, the top plate parasitic resistance is $R_{P_1}$ 92, and the bottom plate parasitic resistance is $R_{P_2}$ 93. Referring again to FIG. 1, note that the top plate 26 is coupled to M6 38 through vias 34. These vias 34 add significant contact resistance to the top plate parasitic resistance. Second, the capacitor value is limited by area constraints. The M5 18 and M6 38 levels are used for circuit connectivity. The capacitor must fit in the unused routing area. Third, there is a significant risk of interference with other circuit signals since the capacitor is formed in the interconnect routing levels M5 and M6.

Referring now to FIG. 2, a top view of an exemplary and conventional integrated circuit inductor 50 is shown. The inductor 50 is formed as a spiral line comprising M6 58 and M5 54. To facilitate interconnection the M5 line 54 is coupled to M6 58 through the via 60. Referring now to FIG. 3, a cross sectional view of the FIG. 2 inductor is shown. Several features should be noted. First, the inductor is formed in the upper metal layers M6 58 and M5 54. Next, note that the through metal M5 54 is coupled using vias 60. In addition, the inductor is formed over a part of the substrate 70 comprising a shallow trench isolation (STI) 74.

Several problems with this approach to forming the inductor should be noted. First, because the current flow through the inductor is parallel to the surface of the substrate 70, the magnetic flux 86 is primarily perpendicular to the surface of the substrate 70. This is why the inductor is fabricated over a part of the integrated circuit where no active devices are formed. Therefore, although the inductor is formed in an upper metal level, it still effectively consumes surface area in the substrate 70. Second, the inductor value is limited by the available surface area. Third, the vias 60 create a significant parasitic resistance that reduces the Q value of the inductor. Referring again to FIG. 4, the circuit model of inductor is shown. The inductor value is given by L 94. The parasitic resistance value is given by $R_P$ 97 and a parasitic capacitor value is given by $C_P$ 96. Referring again to FIG. 2, this parasitic capacitance is caused by a MIM capacitor created by the interaction between the spiral metal lines 58 and the dielectric 62 therebetween. Fourth, the methods of forming the exemplary spiral inductor and capacitor are not compatible.

It would therefore be advantageous to form RF devices such as inductors and capacitors that can be constructed without consuming additional area on the substrate, enabling, for example, active devices to be formed below the RF devices.

Furthermore, in today's semiconductor manufacturing and assembly industry, versatility of devices has become a prominent consideration. It would be desirable to provide on a chip, a network of RF devices that is alterable, i.e., in which a desired capacitance and/or inductance value can be achieved by selecting portions of the RF network that provide the desired inductance and/or capacitance values. Versatility is also advantageous in SOC (System On a Chip) and SIT (System In Package) technologies that are being used increasingly in today's electronics industry. In addition to any RF devices included in one component, it would be additionally advantageous to directly access RF networks formed on other chips. It would be particularly advantageous to selectively couple to individual RF devices or portions of an RF network formed on another chip. It would therefore be particularly desirable to provide an alterable network of RF devices at a chip top level that includes components that are directly accessible by remote components and can be constructed without consuming additional area on the substrate.

SUMMARY OF THE INVENTION

To achieve these and other objects, and in view of its purposes, an aspect of the invention provides an effective and manufacturable method to form radio frequency (RF) devices in an integrated circuit device. A further object of the invention is to provide a method to form MIM capacitors having improved parametric performance.

A further object of the invention is to provide a method to form inductors having improved parametric performance. Another object of the invention is to provide a method to form RF devices producing less interference with other circuits in the integrated circuit device. Yet another object of the invention is to provide both capacitors and inductors in a top metal layer.

According to one aspect, the invention provides a method for forming RF devices in the manufacture of an integrated circuit device. The method includes providing the substrate, forming RF devices using an RF metal level that is an uppermost metal level in the integrated circuit device, forming a passivation layer over the RF metal level, forming openings in the passivation layer to provide direct access to individual ones of the RF devices, and forming electrical connections through at least some of the openings to individually couple at least some of the RF devices to a further device formed on a further substrate.

According to another aspect, the invention provides a method for forming RF devices in the manufacture of an integrated circuit device. The method includes providing a substrate, forming RF devices using an RF metal level that is an uppermost metal level in the integrated circuit device, the RF metal level including connective lines that couple together at least some of the RF devices. The method further includes forming a passivation layer over the RF metal level, forming openings in the passivation layer to expose relatively thin interconnect leads of the connective lines that serve as fuses, and selectively altering the RF metal level by cutting at least some of the relatively thin connective lines using a laser directed through at least one of the openings.

According to another aspect, the invention provides a semiconductor device. An integrated circuit device comprises a patterned upper metal level overlying a substrate wherein the upper metal level comprises bottom plates for capacitors and terminals for inductors. The integrated circuit device also includes a dielectric layer overlying the upper level metal, a patterned RF metal level overlying the upper level metal and the dielectric layer, wherein the RF metal level comprises top plates for the capacitors overlying the bottom plates with the dielectric layer therebetween and wherein the RF metal level further comprises inductive lines for the inductors. At least some of the capacitors and inductors are coupled together to form an RF network. A passivation layer overlies the RF metal level and includes a plurality of openings therethrough, the openings exposing individual ones of the capacitors and inductors to provide direct access to the individual ones of the capacitors and inductors through the openings

BRIEF DESCRIPTION OF THE DRAWING

The invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing. Included are the following figures.

FIGS. 5 through 11 illustrate a process sequence according to a first embodiment of the invention.

DETAILED DESCRIPTION OF THE EMBODIMENTS

Figure 1:
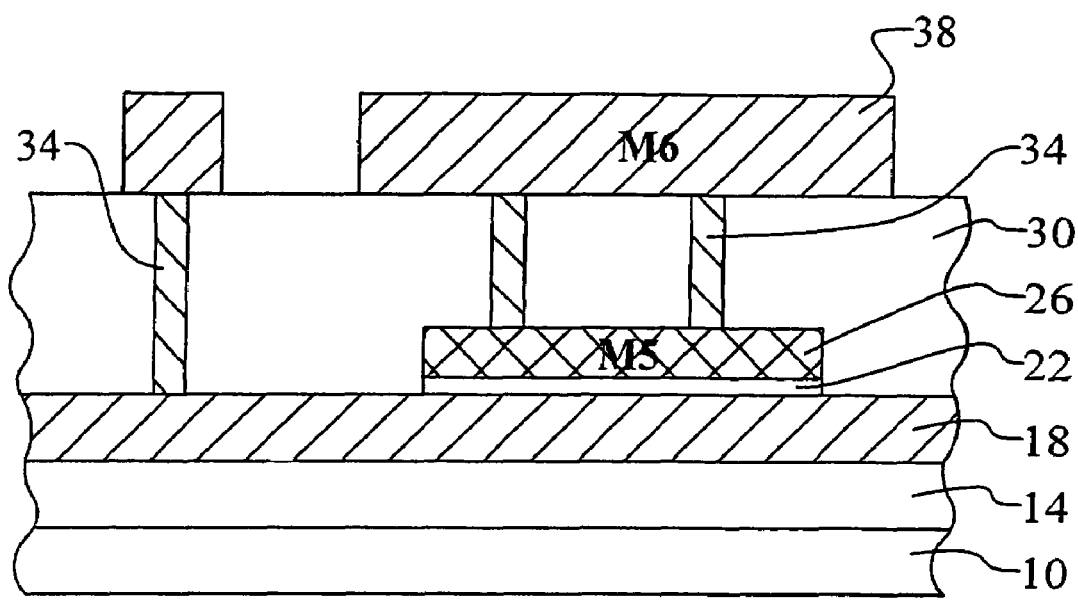
FIG. 1 illustrates an exemplary metal-insulator-metal (MIM) capacitor in cross section, according to the prior art.
Figure 2:
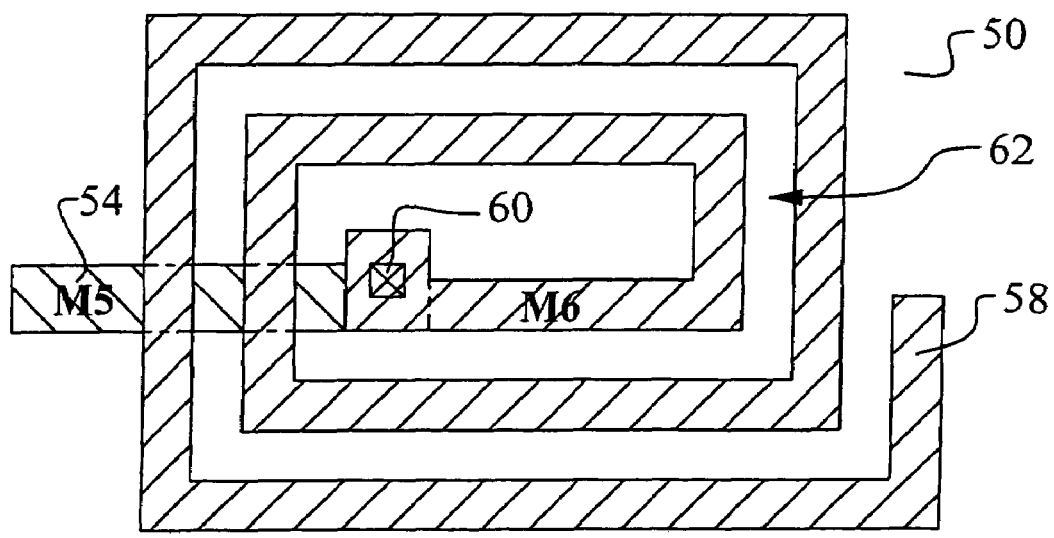
FIGS. 2 and 3 illustrate an exemplary spiral inductor in top view and in cross section, according to the prior art.
Figure 3:
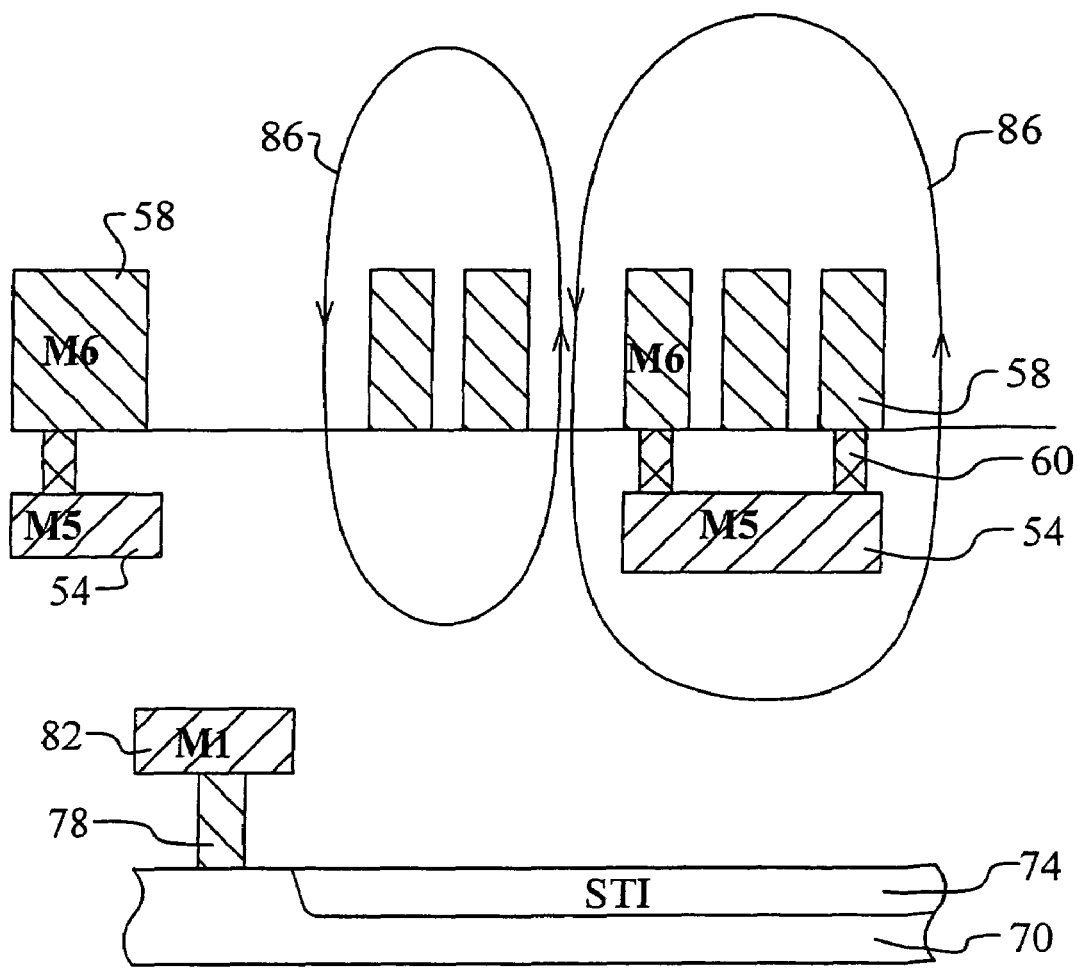
Figure 4:
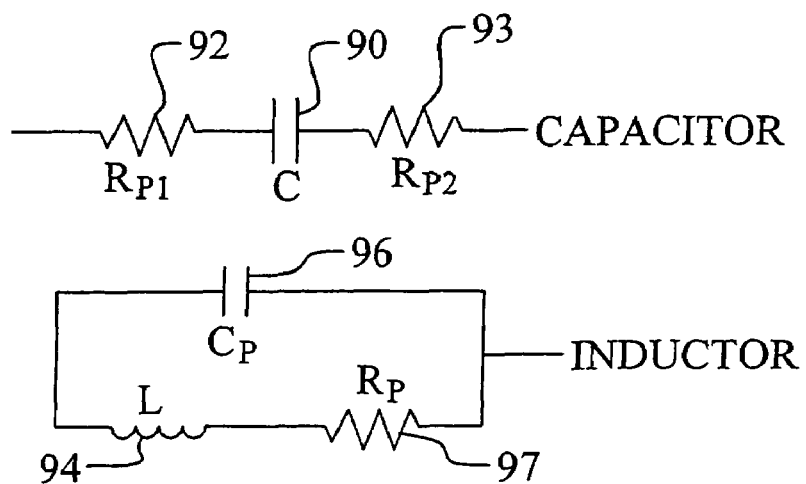
FIG. 4 illustrates circuit models for exemplary MIM capacitors and spiral inductors, according to the prior art.

The preferred embodiments of the present invention disclose a method to form RF devices in the manufacture of an integrated circuit device. The method is useful for the formation of high quality capacitors and inductors in a common process. It should be clear to those experienced in the art that the present invention can be applied and extended without deviating from the scope of the present invention.

Referring now to FIGS. 5 through 11, a first exemplary embodiment of the present invention is illustrated. Several important features of the present invention are shown and discussed below. A partially completed integrated circuit device is shown in cross section. The method comprises providing a substrate 110. Preferably, the substrate 110 comprises silicon but could comprise silicon-on-insulator or any other semiconductor material. For simplicity of illustration, the substrate 110 is shown monolithically. It is understood by those skilled in the art that the substrate would further comprise active devices, such as transistors, formed by known methods.

As an important feature of the present invention, a top metal level 118 is defined overlying the substrate 110. An insulating layer 114 is formed overlying the substrate to isolate the substrate 110 from the top metal level layer 118. A typical integrated circuit device may comprise a plurality of metal levels. For example, the top metal level 118 may be the sixth or seven metal level in the interconnection scheme. Therefore, the insulating layer 114 is in fact much thicker than shown and may comprise a plurality of metal levels that are formed above the substrate 110 but below the top metal level 118. The top metal level 118 is herein construed as the metal level wherein the pads for the integrated circuit device are formed. This metal level 118 is compatible with the pad formation process for the device. For example, wire bonding pads are formed in this level 118. Alternatively, the top metal level 118 may be the foundation layer for the formation of flip chip, solder bumps.

In the first embodiment, the top metal level 118 is defined using a deposit/etch process. In this embodiment, the top metal level 118 is deposited overlying the insulating layer 114. The top metal level 118 may be deposited using, for example, physical vapor deposition (PVD) or sputtering. Further, the top metal level 118 may comprise aluminum, copper, or an alloy of aluminum and copper. Further, the top metal level 118 may comprise a series of layers. For example, a barrier layer such as titanium nitride may be formed over or under an aluminum/copper layer to create the entire top metal level 118.

Referring now to FIG. 6, as an important step in a deposit/etch sequence, the deposited top metal level 118 is patterned. For example, a photoresist layer, not shown, may be coated overlying the metal level 118. The photoresist layer is then exposed to actinic light through a mask and developed. The remaining photoresist layer is then used to mask the metal level 118 during a metal etching process. Following the metal etch, the photoresist layer is removed to reveal the remaining top metal level 118 as shown. The top metal level 118 remaining comprises pads 122 and portions of planned RF devices 126, 130, and 134.

Referring now to FIG. 7, as an important feature in the first embodiment, a first passivation layer 138 is formed overlying the top metal level 118. The first passivation layer 138 may comprise any dielectric material. More preferably, the first passivation layer 138 comprises a silicon nitride layer that is deposited using, for example, low pressure, chemical vapor deposition (LPCVD). The first passivation layer 138 is then patterned to selectively expose the pads 122 and the parts 126, 130, and 134 of planned RF devices. The first passivation layer 138 may be patterned using a photoresist/etch process as described above.

Referring now to FIG. 8, a dielectric layer 142 is formed overlying the top metal level 118 and the first passivation layer 138. This dielectric layer 142 may comprise any suitable dielectric material. The dielectric layer 142 may comprise silicon dioxide deposited using plasma enhanced chemical vapor deposition (PE-CVD). This dielectric layer 142 is formed to create a MIM capacitor dielectric thickness for the particular operating conditions of the process. For example, the dielectric layer 142 is formed to a thickness of between about 100 Angstroms and 1,000 Angstroms.

As an important feature, the dielectric layer 142 is patterned to selectively expose the top metal level 118. More particularly, the dielectric layer 142 is patterned such that is covers planned bottom plates 126 of the capacitor and the planned pads 122 for the integrated circuit devices. At the same time, the dielectric layer 142 is removed from the planned top plate 130 of the capacitors and from the planned inductor 134. This dielectric layer 142 may be patterned, for example, using a photoresist/etching process as described above.

Figure 9:
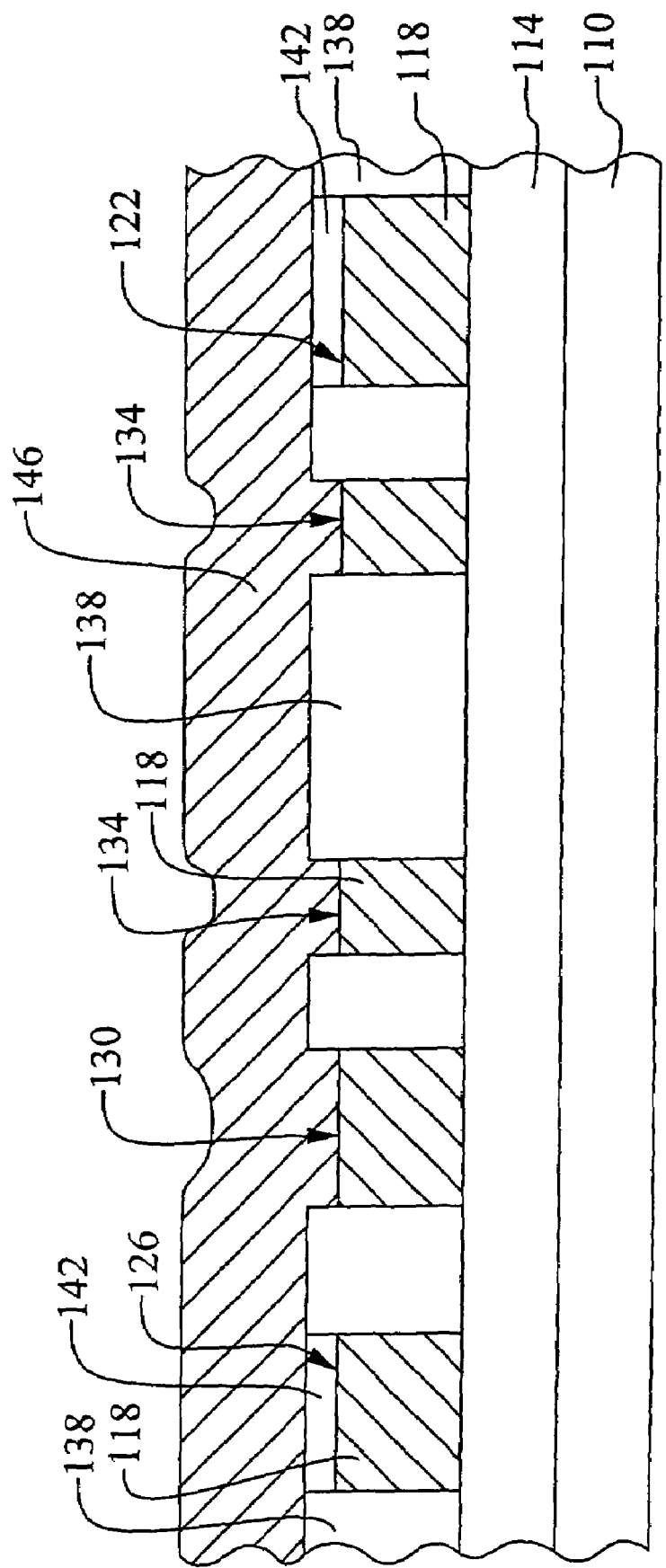

Referring now to FIG. 9, as another important feature of the first embodiment, an RF metal level 146 is deposited overlying the top metal level 118 and the dielectric layer 142. The RF metal level 146 comprises a metal layer that is specifically constructed to form top plates of capacitors and to form inductors having superior Q values. More preferably, the RF metal level 146 comprises aluminum, copper, or an alloy of aluminum and copper. Further, the RF metal level 146 may comprise a barrier layer, such as titanium nitride, deposited over or under the metal layer. The RF metal level 146 may be deposited, for example, using PVD or sputtering. As a particularly useful feature of the present invention, the RF metal level 146 may be made relatively thick. This is because the RF metal level 146 does not have to fit within the interconnect scheme between the top metal level and the underlying metal level as in the prior art. Rather, the RF metal level 146 can be made substantially thicker than in of the prior art. This leads to significant advantages in reducing parasitic resistance and in improving the Q value.

Figure 10:
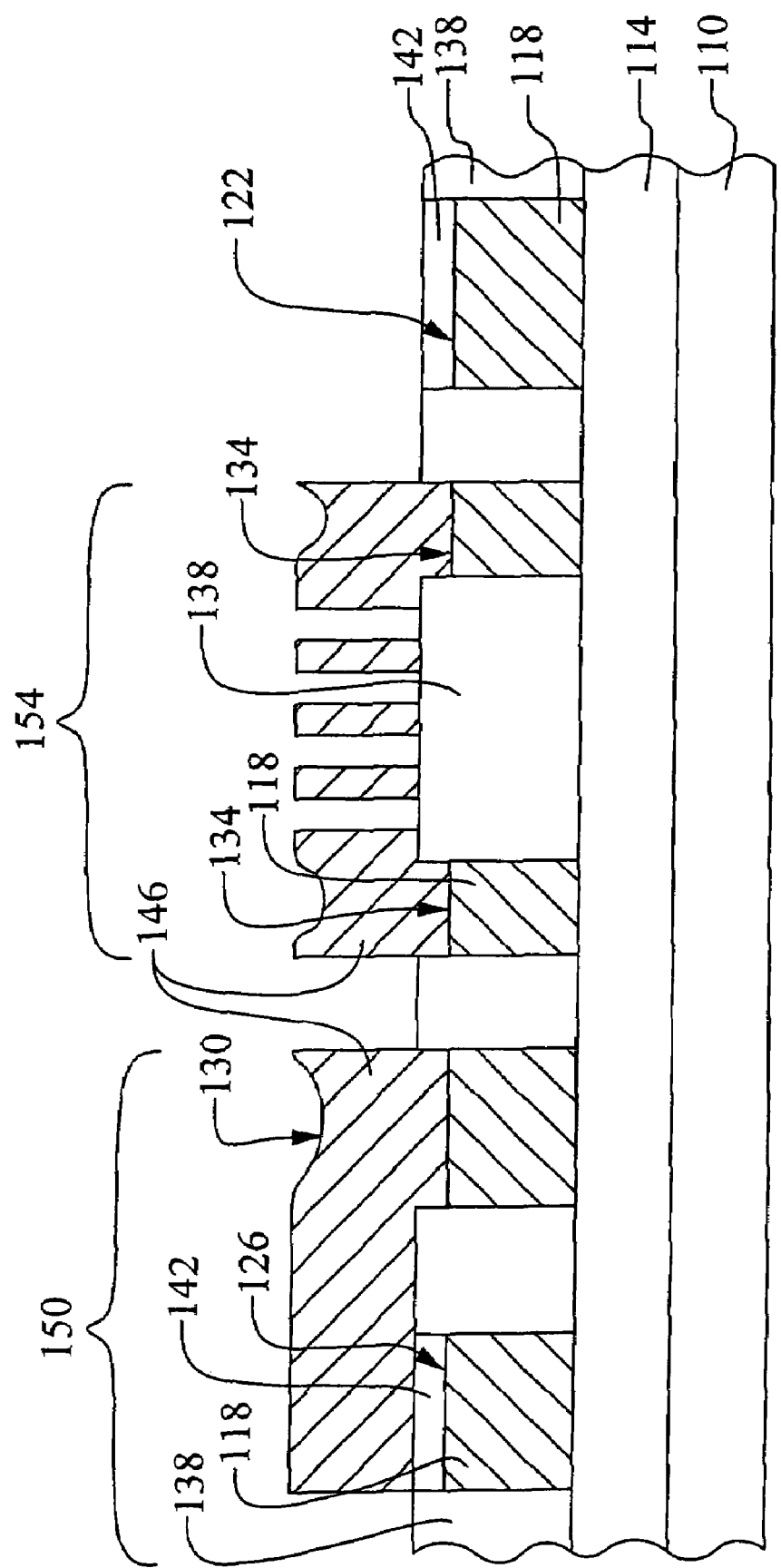

Referring now to FIG. 10, the RF metal level 146 is defined overlying the dielectric layer 142 and the top metal level 118 to thereby complete the RF devices 150 and 154. More specifically, the RF metal level 146 is patterned using, for example, a photoresist/etching process as described above. The resulting RF metal level 146 remains above the capacitors 150 to form the top plates of those capacitors 150. Further, the RF metal level 146 is patterned to form inductors 154, called zigzag inductors. The RF metal level 146 is removed from the pads 122.

Figure 19:
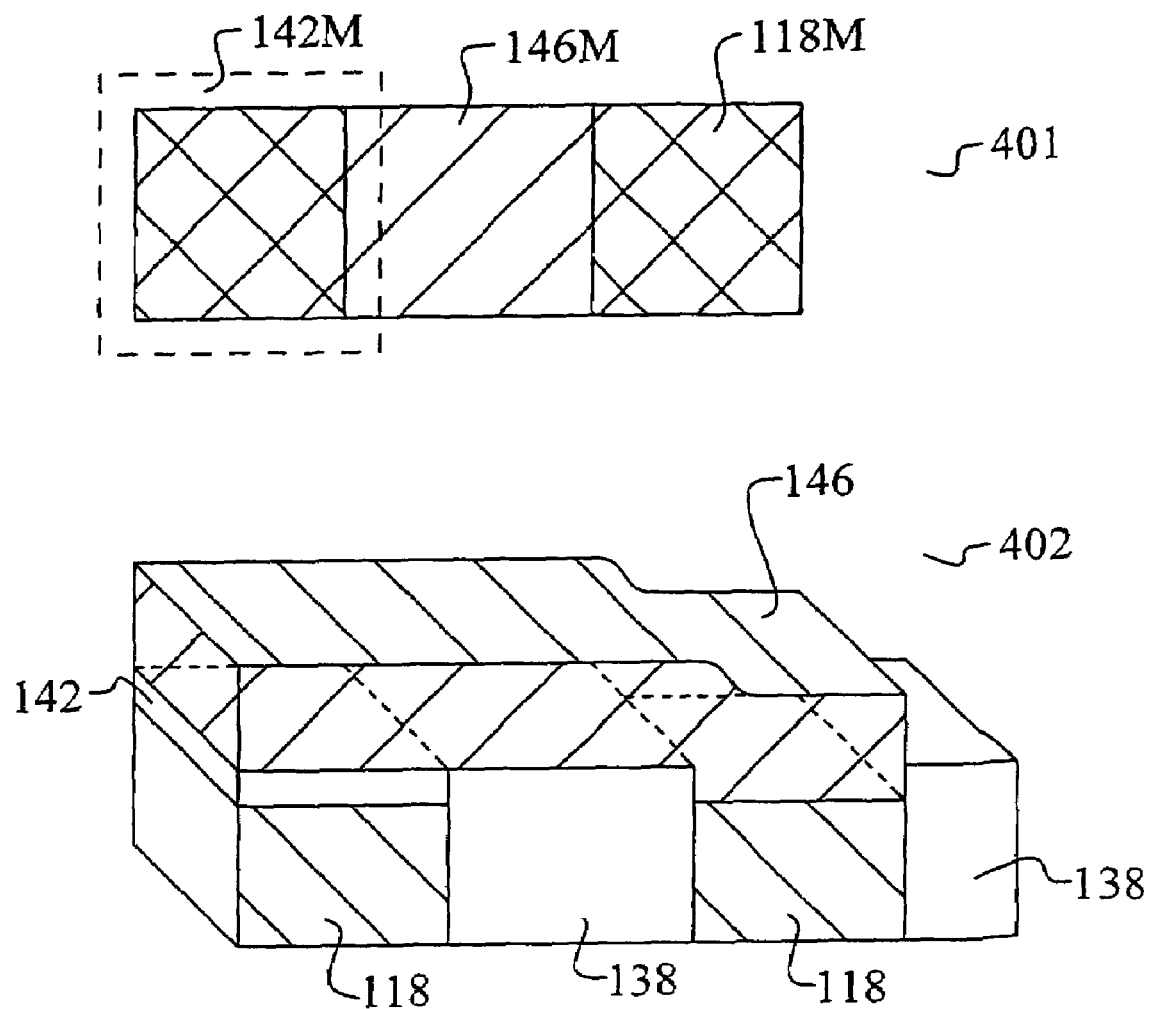
FIG. 19 illustrates a top layout view and an isometric view of an exemplary capacitor of the invention.

Referring now to FIG. 19, a top layout view 401 and an isometric view 402 of the capacitor formed in the present invention are shown. The layout view 401 shows the dielectric layer mask 142M at the intersection of the RF metal layer mask 146M and the top metal layer mask 118M. The isometric view 402 shows the relationship of the RF metal layer 146, the dielectric layer 142, and the top metal layer 118.

Figure 20:
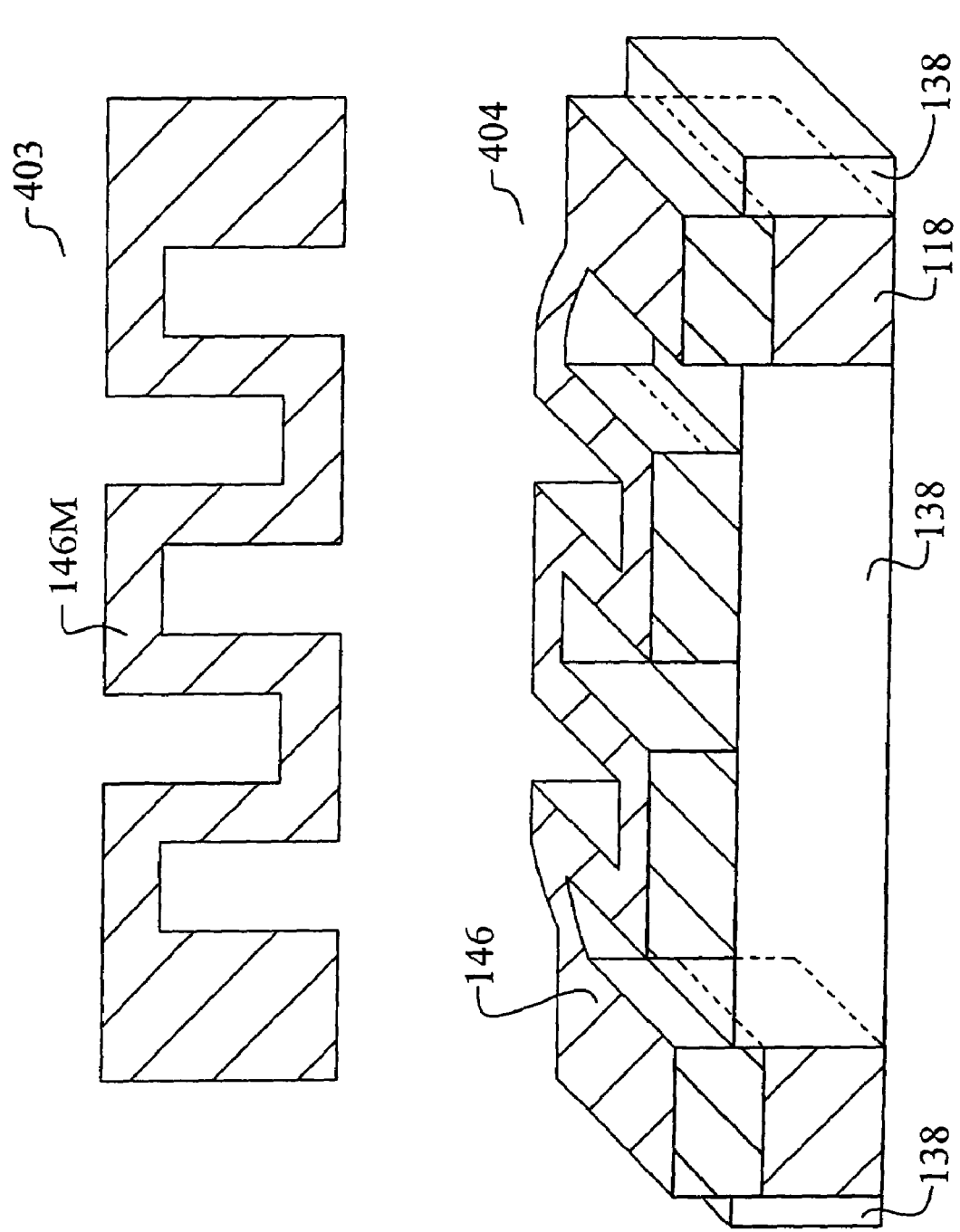
FIG. 20 illustrates a top layout view and an isometric view of an exemplary inductor of the invention.

Referring now to FIG. 20, a top layout view 403 and an isometric view 404 of the inductor formed in the present invention are shown. The layout view 403 shows the RF metal layer mask 146M and illustrates an exemplary "zigzag" inductor layout. The isometric view 404 shows the relationship of the RF metal layer 146, the top metal layer 118, and the first passivation layer 138.

Figure 11:
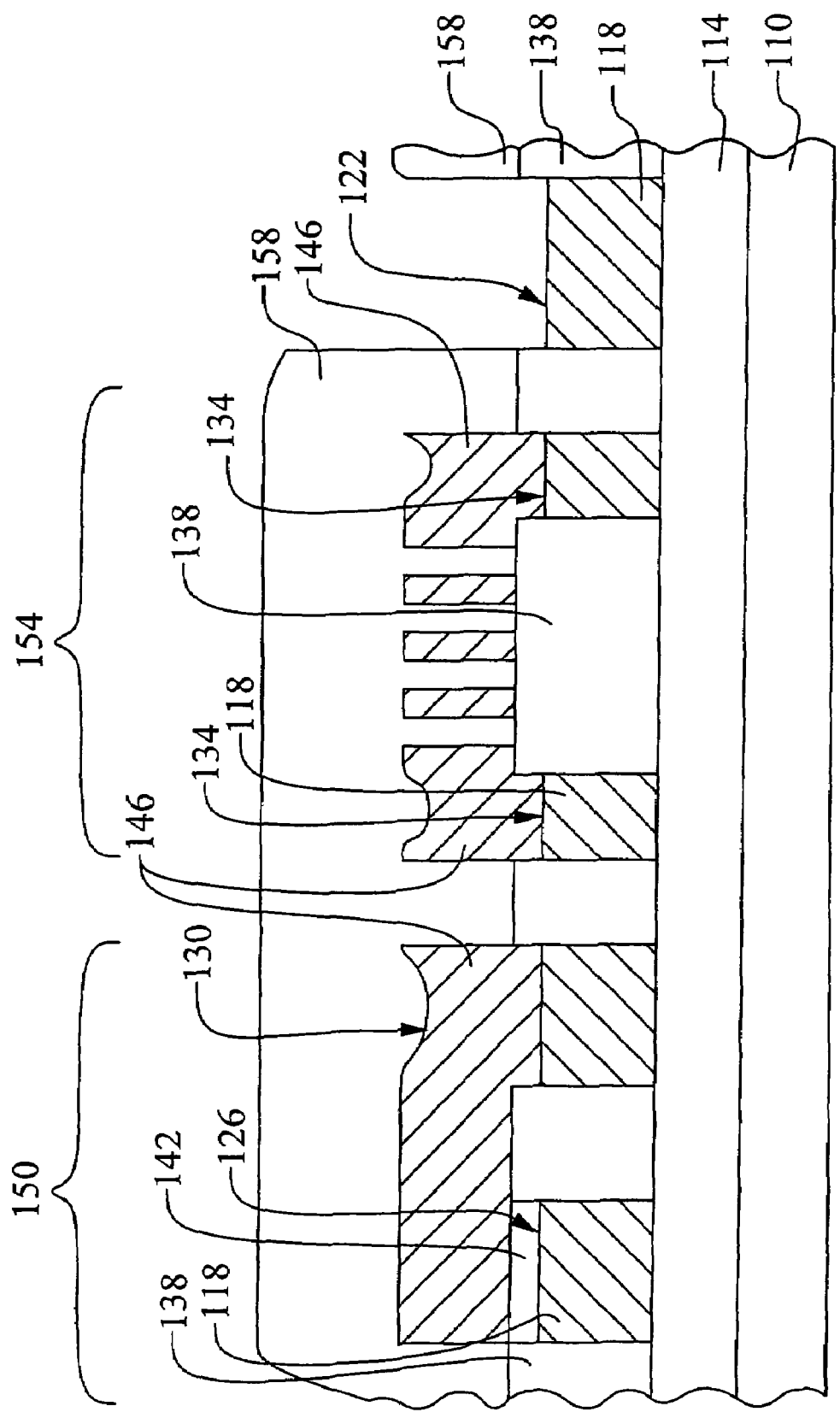

Referring now to FIG. 11, a second passivation layer 158 is formed overlying the RF metal level 146, the dielectric layer 142, and the top metal level 118. The second passivation layer 158 may comprise any suitable dielectric material such as silicon nitride deposited using LPCVD. The second passivation layer 158 is then patterned to expose the pads 122. The second passivation layer 158 may be patterned using, for example, a photoresist/etching process as described above. During the etching step, the dielectric layer 142 overlying the pads 122 is removed to reveal the top metal level 118.

The resulting devices 150 and 154 provide several advantages over the prior art examples. First, since the RF metal level 146 is now the top most metal, the constraints which required a relatively thin top plate metal in FIG. 1 are no longer valid. Therefore, the RF metal level 146 can be made thicker to reduce the parasitic resistance in the capacitor 150. Second, vias are not needed for either the capacitor 150 or the inductor 154. Therefore, the parasitic resistance caused by vias is eliminated. Each of these effects results in an improved Q value for the RF devices 150 and 154. Third, the zigzag inductor 154 that is formed in the RF metal level 146 generates less magnetic flux near the surface of the substrate 110. Therefore, active devices, such as transistors, may be formed in the substrate 110 in the area immediately below the inductor 146. This means that a large value inductor may be formed without consideration for the effects on the underlying circuit layout in the substrate 110. Fourth, since the capacitor 150 is formed above the top level metal 118, interference with underlying circuits is minimized, and a large value capacitor may be formed with minimal effect on these circuits.

Figure 12:
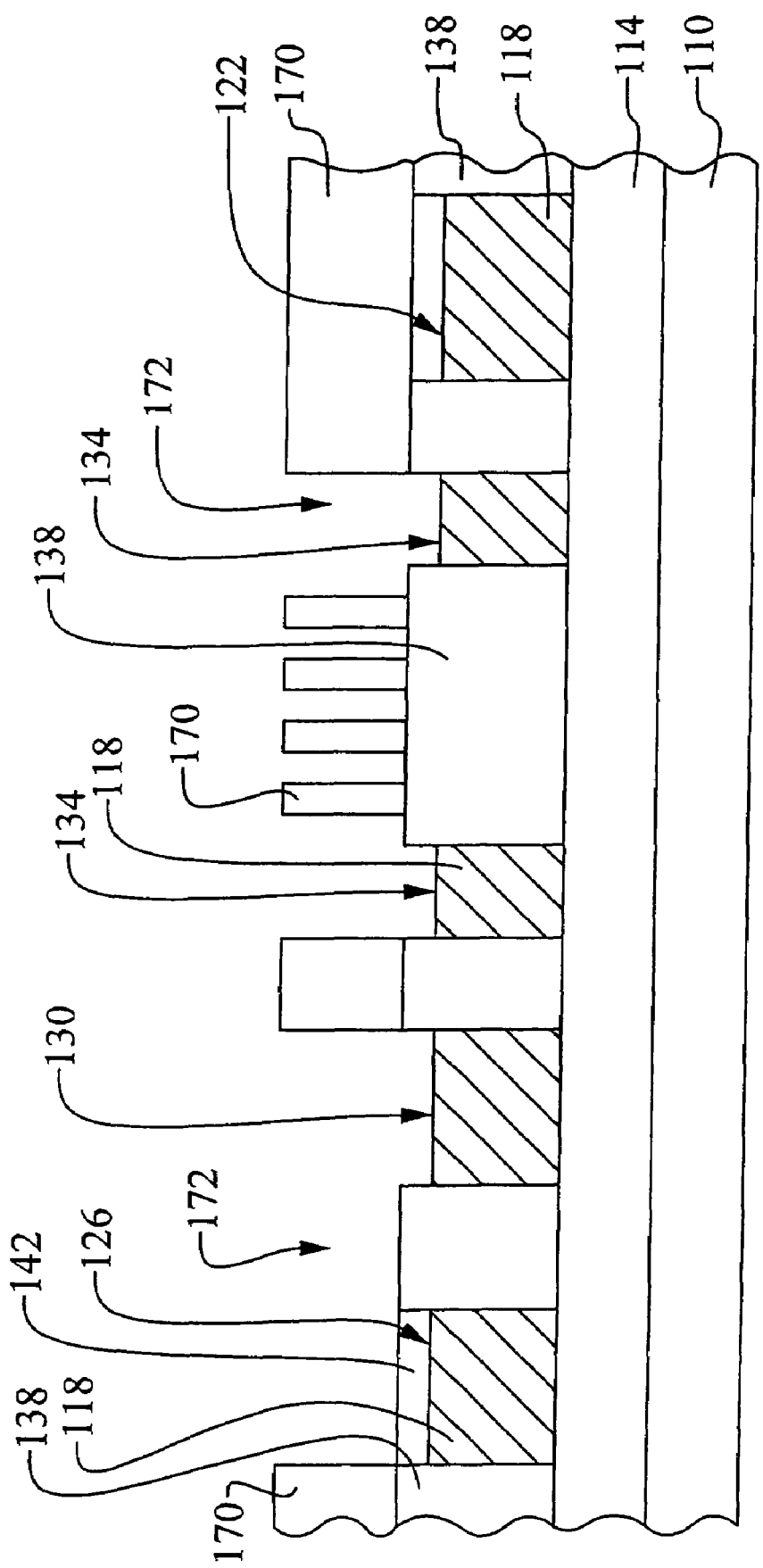
FIGS. 12 through 14 illustrate a process sequence according to a second embodiment of the invention.
Figure 13:
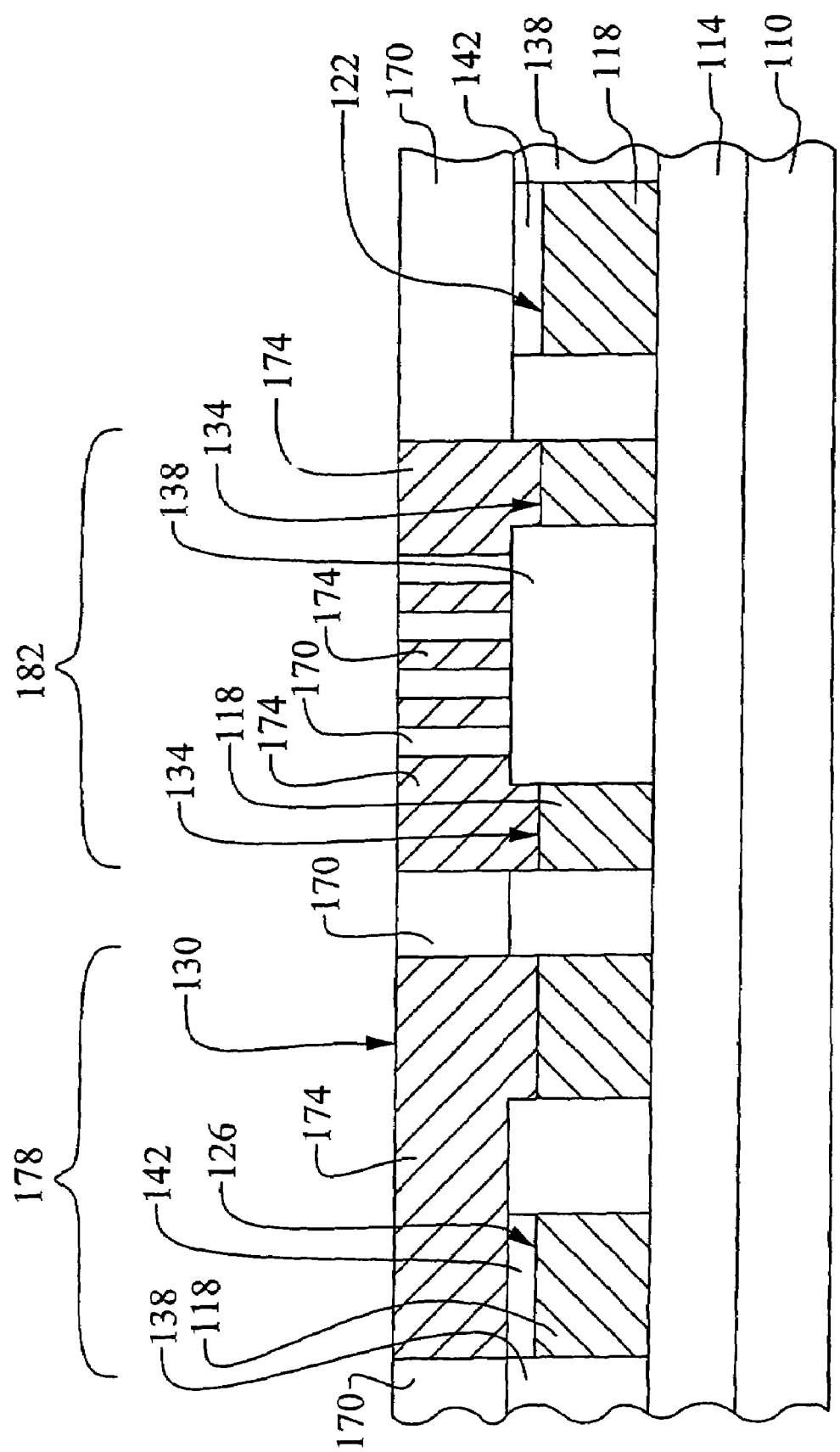
Figure 14:
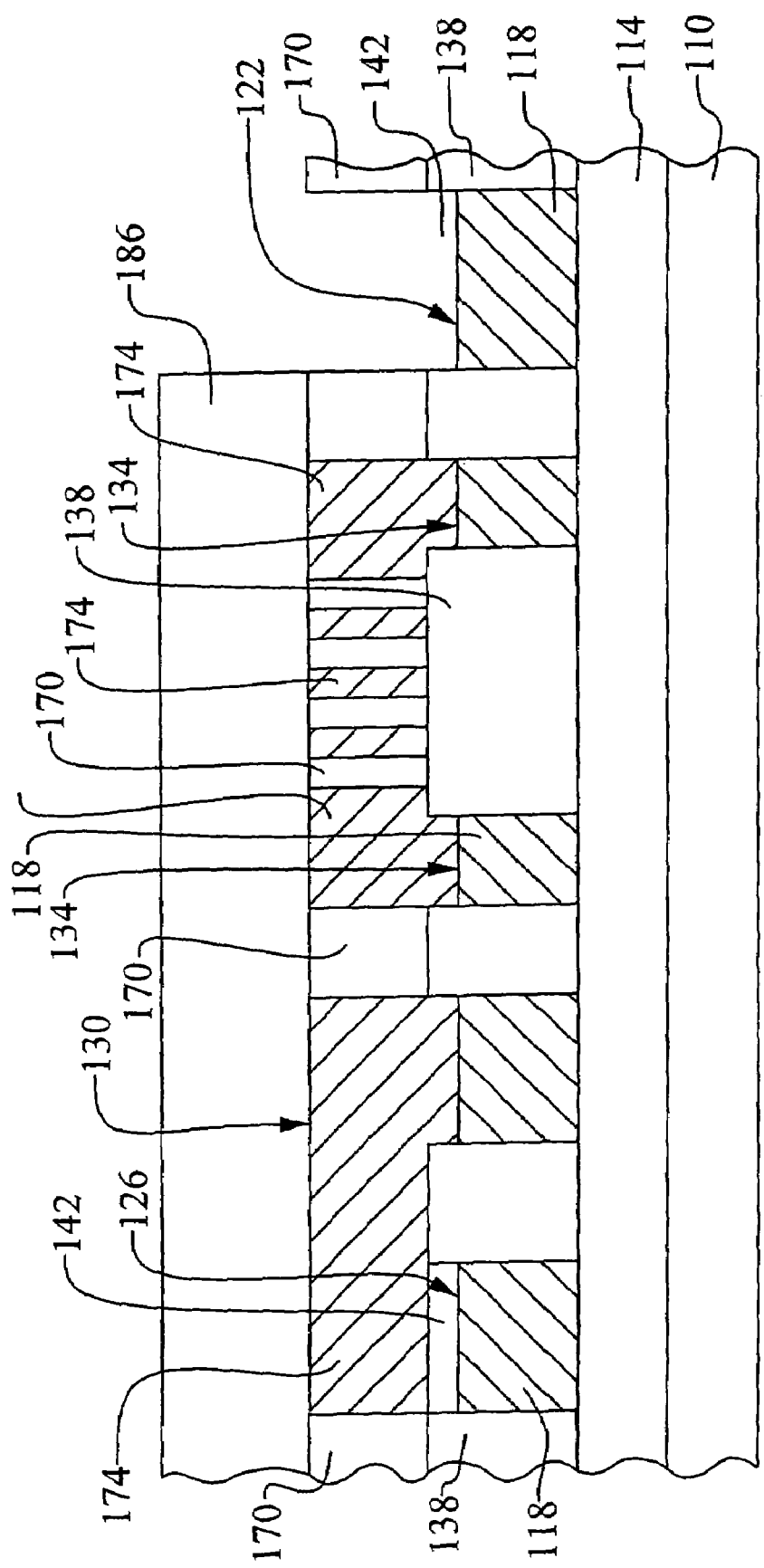

Referring now to FIGS. 12 through 14, a second embodiment of the invention is illustrated. In this case, a damascene process may be used to define the top metal level and the RF metal level. If copper is used for the metal levels, then it may be necessary to use a damascene process technique to define these metal level since it is very difficult to precisely etch copper.

In this second exemplary embodiment, the step of defining the top metal level 118 comprises, first, depositing the top level dielectric 138 overlying the substrate 110. The top level dielectric 138 may comprise a first passivation layer. The top level dielectric 138 is patterned to form trenches. The top metal level 118 is deposited overlying the top level dielectric 138 and filling the trenches. The top metal level 118 is then planarized. This planarization may comprise, for example, a chemical mechanical polish (CMP) step where the metal is polished down to below the top level dielectric layer 138. Other planarization approaches in the art may also be used.

In this second embodiment, the step of defining the RF metal level comprises first depositing a RF level dielectric 170 overlying the first passivation layer 138, the dielectric layer 142, and the top metal level 118. The RF level dielectric 170 is patterned to form trenches 172. For example, the RF level dielectric 170 may be patterned using a photoresist/etching process as described above. Trenches 172 are defined for the capacitor top plates and the inductors. The RF level dielectric 170 remains overlying the pads 122.

Referring now to FIG. 13, the RF metal level 174 is deposited overlying the RF level dielectric 170 and filling the trenches. This RF metal level 174 may be deposited using, for example, PVD, sputter, or a plating operation. The RF metal level 174 is then planarized to complete the RF devices 178 and 182. The planarization step may comprise, for example, a CMP step. Other planarization approaches in the art may also be used. Referring now to FIG. 14, a second passivation layer 186 is formed overlying the RF metal level 174 and the first passivation layer 170. The second passivation layer 186 is patterned such that it is removed from the pads 122 while remaining overlying the RF devices.

Figure 15:
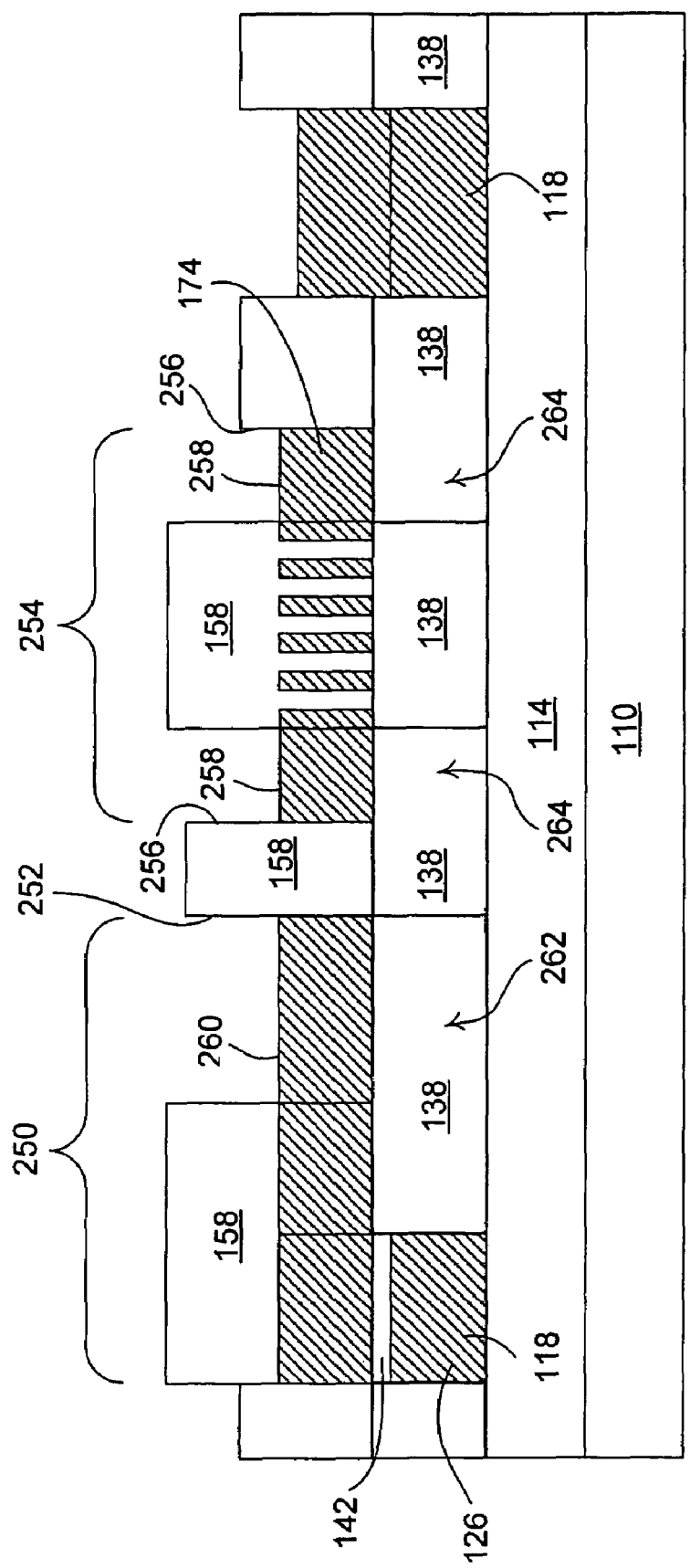
FIG. 15 illustrates a cross-sectional view of another exemplary embodiment of an integrated circuit layout of the invention.

FIG. 15 is a cross sectional view showing another advantageous aspect of the present invention. FIG. 15 is similar to the embodiment shown in FIG. 11 in which like features are identified by the same reference numbers. An advantageous aspect that distinguishes the embodiments shown in FIG. 11 and FIG. 15 is that in FIG. 15, capacitor 250 and inductor 254 may be individually coupled directly to other devices through openings formed in second passivation layer 158. Correspondingly, portions of top metal level 118 that are present in FIG. 11 and used to internally couple the RF devices to pad 122 and to further devices ultimately through pad 122, are not needed. Top metal level 118 may be patterned using previously described patterning techniques to form the pattern shown in FIG. 15 which is notably deficient of portions of top metal level 118 directly below MIM capacitor 250 and inductor 254. It is notable that region 262 beneath contact 260 does not include a lead of top metal level 118 but rather is formed of first passivation layer 138. Passivation layer 138 is also disposed beneath inductor 254 in regions 264 which included portions of top metal level 118 in the embodiment illustrated in FIG. 11.

Capacitor 250 is directly accessible from above by opening 252 formed in second passivation layer 158. Opening 252 includes contact 260 which may be directly coupled by wire bonding or other techniques, to other components. Contact to inductor 254 may be provided by direct coupling to contacts 258 formed in openings 256 formed in second passivation layer 158. Conventional patterning techniques such as used to expose pads 122 in the embodiment shown in FIG. 11, may be used to simultaneously form openings 252 and 256 that provide direct access to individual capacitor 250 and individual inductor 254. Contact may be made to individual RF devices such as capacitor 250 and inductor 254 through openings 260 and 258, respectively. Through these openings, individual RF components may be directly coupled to other external devices including but not limited to devices formed on other substrates and/or other devices formed in the same package as substrate 110. In another exemplary embodiment, the RF components, i.e. capacitor 250 and inductor 254, may be coupled to other devices formed on substrate 110 through the openings formed in second passivation layer 158.

Capacitor 250 may be internally coupled to other capacitors formed on substrate 110 to form an RF network. Similarly, inductor 254 may be coupled to other inductors formed on substrate 110 to form an inductor network. In still another exemplary embodiment, the RF network of interconnected RF devices may include capacitors and inductors. The interconnection of the devices of the RF network may be accomplished using conventional means such as using top metal level 118 to connect the devices to one another, although top metal level 118 is omitted from FIG. 15 to show the aspect of direct coupling from above in the illustrated embodiment. In another embodiment, RF metal level 174 may be used to couple the RF devices and form a network. Using the openings that provide direct access to the individual components, external devices may be selectively coupled to individual ones or a network of various combination of the RF devices. In one embodiment, a desired capacitance value may be chosen and the external device coupled to a network or plurality of capacitors that collectively provide the desired capacitance value. In another embodiment, a desired inductance value may be chosen and the external device coupled to a network or plurality of inductors that collectively provide the desired inductance value. Networks having desired inductance and capacitance values may also be selectively coupled to a further device. The RF components or network of an integrated circuit formed on substrate 110 may thereby be directly coupled to devices formed on other substrates or other components and may be advantageously used in SOC or SIP applications.

Figure 16:
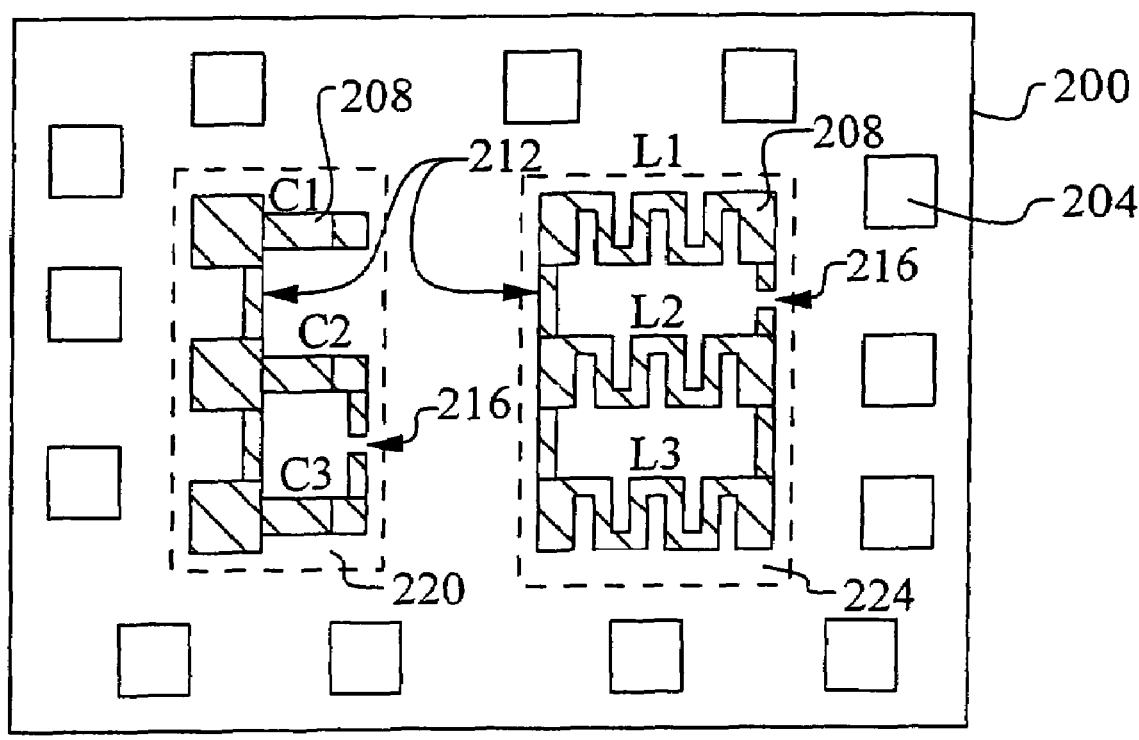
FIG. 16 illustrates a top view of an integrated circuit layout of the invention.

Referring now to FIG. 16, a top view of an integrated circuit device 200 formed using the method of the present invention is shown. The illustration shows pads 204 formed using the top metal level. Capacitors C1-C3 are formed within the device 200 by the method described above. The RF metal layer 208 is shown. Different sizes of capacitors can be formed as shown by the different sizes of top plates. Inductors L1-L3 are also formed using the method of the present invention.

Several important features should be noted. First, excepting the pad areas, almost the entire area of the integrated circuit device 200 is available for forming the novel RF devices (C and L). Therefore, relatively large RF devices can be formed without increasing the area of the integrated circuit device 200. Second, capacitors and inductors may be formed in parallel or in series. For example, the capacitors C1-C3 are connected together using the RF metal layer 208 to form a capacitor network 220. Similarly, the inductors L1-L3 are connected using the RF metal layer 208 to form an inductor network 224. Further, combinations of capacitors and inductors may be connected using the RF metal layer 208 to form RF networks, or LC networks.

Third, these networks 220 and 224 can be configured to be precisely tuned. For example, the capacitors C1-C3 in the network 220 could be coupled together in series, in parallel, or in combinations of series and parallel using lines 212 in the RF metal layer 208. To tune the fabricated network 220, the network 220 performance would first be measured. Preferably, the capacitance of a capacitor network 220 would be measured directly, using a capacitance meter, or indirectly, by measuring a parameter of the circuit in which the network 220 is included. For example, a time constant could be measured to determine the relative value of the capacitor network 220. Next, if the measured value does not fall within specification, the network 220 could be altered by altering the RF metal layer 208.

The RF metal layer 208 could be selectively altered by cutting lines 212 in the RF metal layer that are used to connect individual capacitors and may serve as fuses. This cutting would preferably be performed using a laser device as will be described in conjunction with FIG. 17. In another embodiment, the cutting may be accomplished by "blowing out" the metal lines using a current density that is 100 to 1000 times the normal operating current. The metal lines can be formed to include a suitably narrow width (see FIG. 17) chosen in conjunction with the current that will be used, to enable the excessive current density to "blow out" the relatively thin metal line acting as a fuse. The RF metal layer 208 could be altered by depositing conductive material to make connections between individual capacitors that are not previously connected. To facilitate this approach, the RF metal layer 174 could be designed to have metal lines 208 that are narrowly spaced 216. A machine that can deposit a conductive material to fill such a space 216 could be used to short such metal lines 208. By cutting, depositing, or both cutting and depositing, the capacitance network 220 can be adjusted. The precision of the adjustment possible would depend on how many capacitors are in the network and on the values of each capacitor. A network 220 with a large number of small capacitors would offer the best possible precision. A similar approach can be used to generate a precision inductor value using an inductor network 224 or a precision LC value using an LC network (not shown).

As previously described, openings formed in second passivation layer 158, such as openings 252 and 256 of FIG. 15, may be used to directly couple external components to selected RF devices or custom-tailored RF networks formed of a plurality of RF devices. As shown in the top view of FIG. 17, openings formed in the second passivation layer 158 may additionally provide direct laser access to relatively narrow metal interconnect lines of the RF metal layer such as RF metal layer 208 of FIG. 16, or the top metal level such as top metal level 118 of FIG. 15.

Figure 17:
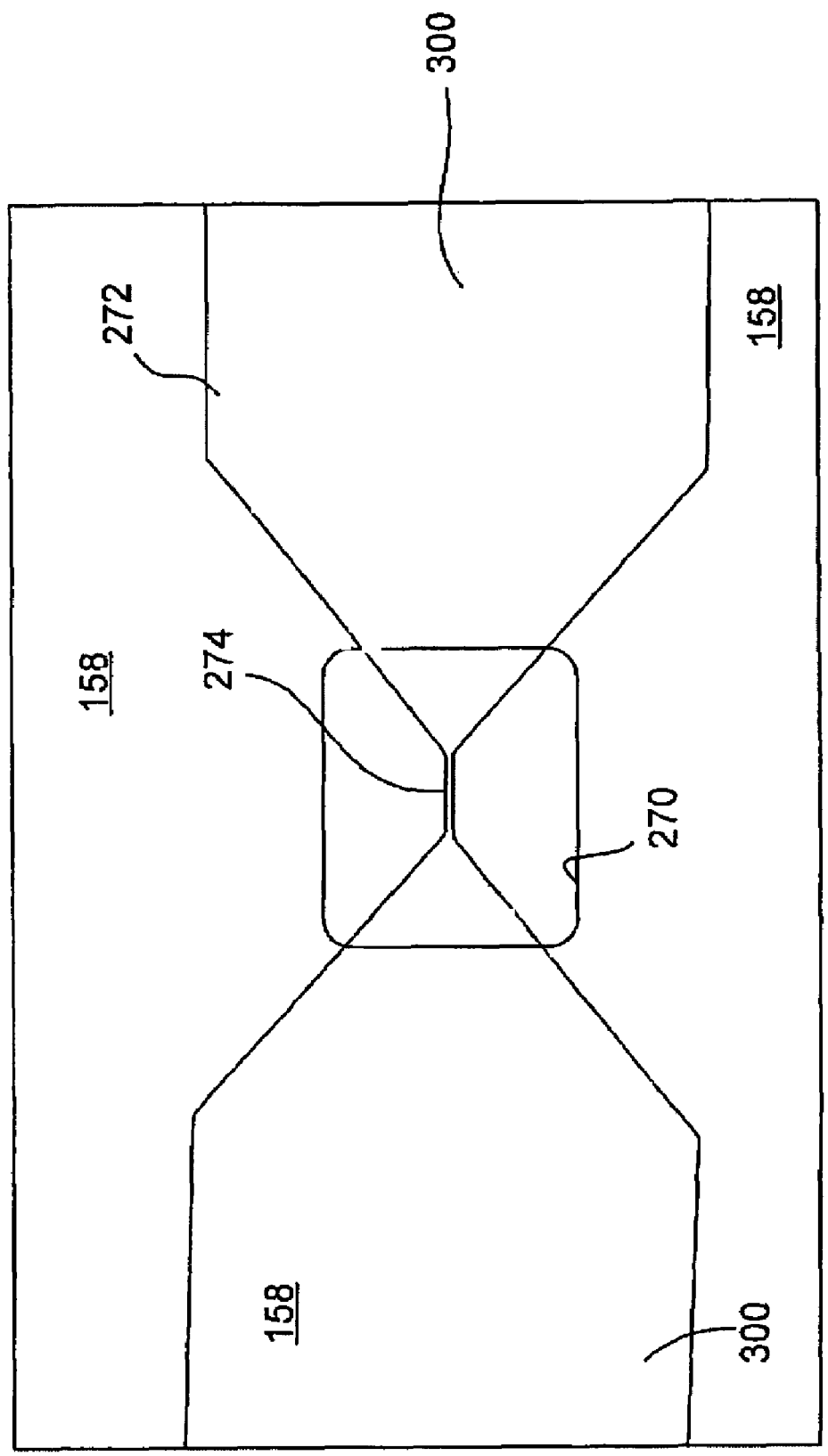
FIG. 17 illustrates a top layout view of a fuse in an alterable RF network according to the invention

FIG. 17 is a top view showing a portion of metal line 300 that may be formed of RF metal level or top metal level. Second passivation layer 158 is formed over the entire device section shown in FIG. 17 except for opening 270 that extends through second passivation layer 158 and exposes relatively narrow section 274 of metal line 300 which also includes relatively wide section 272. The width of relatively narrow portion 274 is chosen so that a laser can be used to cut relatively narrow section 274 which thereby acts as a fuse. By blowing out one or multiple metal lines as such, the RF metal layer is altered and it may be selectively altered to produce a desired capacitance, inductance or other value. In an exemplary embodiment, relatively narrow section 274 may include a width of 0.01 um to 10 um. Relatively narrow section 274 may be chosen to include a width that is less than 20 percent of relatively wide section 272. The laser energy used to cut relatively narrow section 274 will vary depending on the width and thickness of relatively narrow section 274 and in one exemplary embodiment, the laser energy may range from 0.01 uJ to 10 uJ Alternatively, the fuse produced by relatively narrow section 274 may be "blown out" using an exceptionally high current density, as previously described.

Figure 18:
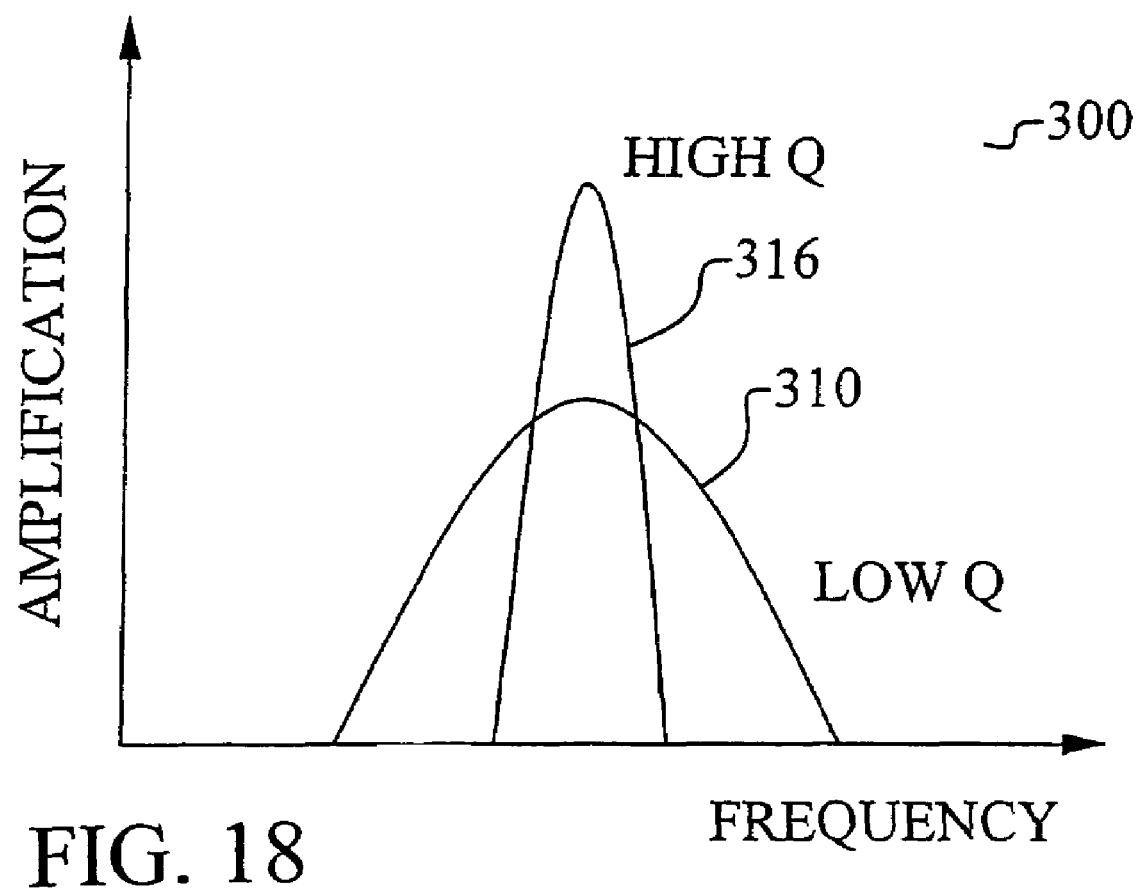
FIG. 18 illustrates the Q factor.

Referring now to FIG. 18, a plot of Q value performance 300 of the RF device is shown. When used in an amplifier, the Q value of the RF device (capacitor, inductor) directly effects the amplification over a frequency range. The amplification 310 is reduced in amplitude and is spread in range where the Q value is reduced. The amplification 316 is increased in amplitude and focused in range for the higher Q value device 316.

The advantages of the present invention may now be summarized. An effective and very manufacturable method to form radio frequency (RF) devices in an integrated circuit device is achieved. The method to form MIM capacitors improves parametric performance. The method to form inductors improves parametric performance. The method to form RF devices produces less interference with other circuits in the integrated circuit device. The method provides both capacitors and inductors in a top metal layer.

The invention provides a method to form RF devices in the manufacture of an integrated circuit device. A substrate is provided. A top metal level is deposited and patterned overlying the substrate. The top metal level comprises pads and portions of planned RF devices. The method also provides forming a first passivation layer overlying the top metal level, patterning the first passivation layer to selectively expose the pads and the parts of planned RE devices, forming a dielectric layer overlying the top metal level and the first passivation layer, patterning the dielectric layer to selectively expose the top metal level, depositing and patterning an RF metal level overlying the dielectric layer and the top metal level to thereby complete the RF devices, forming a second passivation layer overlying the RF metal level, the dielectric layer, and the top metal level and patterning the second passivation layer to expose the pads in the top metal layer.

The RF devices may be capacitors formed where the RF metal level overlies the top metal layer with the dielectric layer the therebetween, other capacitors or inductors. The RF devices may be coupled together by the RF metal layer to form a RF device network. The performance of the RF network may be measured and the RF network selectively altered. The RF metal level may be selectively altered by cutting a line in the RF metal layer using a laser. The selectively altering may be done by depositing a conductive material to short non-connected lines of the RF metal layer.

Another method to form RF devices in the manufacture of an integrated circuit device comprises providing a substrate, depositing and patterning a top metal level overlying the substrate wherein the top metal level comprises pads and portions of planned RF devices. The method includes depositing a top level dielectric overlying the substrate, patterning the top level dielectric to form trenches, depositing the top metal level overlying the top level dielectric and filling the trenches and planarizing the top metal level. A first passivation layer is formed overlying the top metal level, then the first passivation layer is patterned to selectively expose the pads and the parts of planned RF devices. The method includes forming a dielectric layer overlying the top metal level and the first passivation layer, patterning the dielectric layer to selectively expose the top metal level, depositing and patterning an RF metal level overlying the dielectric layer and the top metal level to thereby complete the RF devices. The defining comprises depositing a RF level dielectric overlying the first passivation layer, the dielectric layer, and the top metal level, patterning the RF level dielectric to form trenches, depositing the RF metal level overlying the RF level dielectric, filling the trenches, and planarizing the RF metal level. The method also provides forming a second passivation layer overlying the RF metal level, the dielectric layer, and the top metal level and patterning the second passivation layer to expose the pads in the top metal layer.

Another aspect of the invention is an integrated circuit device comprising a patterned top metal level overlying a substrate wherein the top metal level comprises bonding pads, bottom plates for capacitors, and terminals for inductors, a dielectric layer overlying the top metal level and a patterned RF metal level overlying the top metal level, wherein the RF metal level comprises top plates for the capacitors overlying the bottom plates with the dielectric layer therebetween and wherein the RF metal level comprises inductive lines for the inductors.

Another integrated circuit device of the invention includes a patterned top metal level overlying a substrate wherein the top metal level comprises bonding pads and bottom portions of planned RF devices, a dielectric layer overlying the top metal level; and a patterned RF metal level overlying the top metal level, wherein the patterned RF metal level comprises inductive lines for inductors and top portions for the planned RF devices that overlie the bottom portions of planned RF devices with the dielectric layer therebetween.

While the invention has been particularly shown and described with reference to the preferred embodiments thereof, it will be understood by those skilled in the art that various changes in form and details may be made without departing from the spirit and scope of the invention.

The invention claimed is:

1. A method for forming RF devices, said method comprising:
providing a substrate;
forming RF devices using an RF metal level that is an uppermost metal level in an integrated circuit device;
forming a passivation layer over said RF metal level;
forming openings in said passivation layer to provide direct access to individual ones of said RF devices; and
forming electrical connections through at least some of said openings to individually and directly couple at least some of said RF devices to a further device formed on a further substrate.

2. The method as in claim 1, wherein said RF devices comprise inductors and said forming openings comprises choosing an inductance value and forming electrical connection to a plurality of said inductors that collectively provide said desired inductance value.

3. The method as in claim 1, wherein said RF devices comprise capacitors and inductors and said forming electrical connections comprises choosing at least one of a capacitance value and an inductance value and coupling said further device to at least one of a plurality of said capacitors and a plurality of said inductors that collectively provide said at least one of a capacitance value and an inductance value.

4. The method as in claim 1, wherein said RF devices are further coupled to other devices formed within said integrated circuit device, through said openings.

5. The method as in claim 1, wherein
said forming RF devices includes depositing and patterning said RF metal level to include connective lines that couple together said RF devices to form a RF device network,
said forming openings includes forming openings to expose relatively thin connective lines of said connective lines, and further comprising selectively altering said RF metal level by cutting a line in at least one of said relatively thin connective lines using a laser directed through at least one of said openings.

6. The method as in claim 1, wherein said forming RF devices comprises:
depositing and patterning an upper metal level over said substrate wherein said upper metal level comprises lower portions of said RF devices;
forming an insulating material over said upper metal level;
patterning said insulating material to selectively expose said lower portions of said RF devices; and
depositing and patterning said RF metal level overlying said insulating material and said upper metal level thereby completing said RF devices,
and wherein said passivation layer is further formed over said insulating material and said top metal level and said further device is coupled to said RF metal level.

7. The method as in claim 1, wherein said forming electrical connections comprises wire bonding.

8. The method as in claim 1, wherein said forming openings comprises forming openings that expose contact portions of said individual ones of said RF devices.

9. The method as in claim 1, further comprising providing a package that includes said integrated circuit device and said further device in said package.

10. A method for forming RF devices in the manufacture of an integrated circuit device, said method comprising:
providing a substrate;
forming RF devices using an RF metal level that is an uppermost metal level in said integrated circuit device, said RF metal level including connective lines that couple together at least some of said RF devices;
forming a passivation layer over said RF metal level;
forming openings in said passivation layer to expose relatively thin connective lines of said connective lines, and
selectively altering said RF metal level by cutting at least one of said relatively thin connective lines using a laser directed through at least one of said openings.

11. The method as in claim 10, wherein said forming RF devices comprises:
depositing and patterning an upper metal level over said substrate wherein said upper metal level comprises lower portions of said RF devices;
forming an insulating material over said upper metal level;
patterning said insulating material to selectively expose said lower portions of said RF devices; and
depositing and patterning said RF metal level overlying said insulating material and said upper metal level thereby completing said RF devices, wherein said RF devices include capacitors and inductors.

12. The method as in claim 11, wherein said openings further provide access to individual ones of said RF devices and further comprising providing a further circuit on a further substrate and directly connecting said further circuit to at least some of said RF devices through said openings.

13. The method as in claim 12, wherein said RF devices include capacitors and inductors and said selectively altering comprises connecting said further circuit to a selected plurality of said RF devices to provide at least one of a desired capacitance and a desired inductance.

14. A semiconductor device comprising an integrated circuit device comprising:

a patterned upper metal level overlying a substrate wherein said upper metal level comprises bottom plates for capacitors and terminals for inductors;

a dielectric layer overlying said upper level metal;

a patterned RF metal level overlying said upper level metal and said dielectric layer, wherein said RF metal level comprises top plates for said capacitors overlying said bottom plates with said dielectric layer therebetween and wherein said RF metal level further comprises inductive lines for said inductors, at least some of said capacitors and inductors coupled together to form an RF network; and a passivation layer overlying said RF metal level and including a plurality of openings therethrough, said openings exposing individual ones of said capacitors and inductors to provide direct access to said individual ones of said capacitors and inductors through said openings.

15. The semiconductor device as in claim 14, wherein at least some of said RF devices are directly coupled to a further semiconductor device through said openings.

16. The semiconductor device as in claim 15, wherein said at least some of said RF devices are coupled via wire bonding.

17. The semiconductor device as in claim 15, further comprising a package and wherein said further semiconductor device is disposed on a further substrate contained within said package.

18. The semiconductor device as in claim 15, wherein said further semiconductor device comprises:

a patterned top metal level overlying said substrate wherein said top metal level comprises further bottom plates for further capacitors and further terminals for further inductors;

a further dielectric layer overlying said top level metal; and a patterned further RF metal level overlying said top level metal, wherein said further RF metal level comprises further top plates for said further capacitors overlying said further bottom plates with said dielectric layer therebetween and wherein said further RF metal level further comprises inductive lines for said further inductors, at least some of said further capacitors and further inductors coupled together to form a further RF network.

19. The semiconductor device as in claim 14, wherein said at least some of said capacitors and inductors are coupled by connective lines including relatively narrow conductive lines and relatively wide conductive lines and wherein said openings extending through said passivation level expose at least some of said relatively narrow conductive lines.

20. The semiconductor device as in claim 19, wherein said relatively narrow conductive lines link said relatively wide conductive lines to form a metal lead, said relatively narrow conductive lines having a width no greater than 20% of a width of said relatively wide conductive lines.

* * * * *